United States Patent
Gill

(10) Patent No.: US 6,636,389 B2
(45) Date of Patent: Oct. 21, 2003

(54) GMR MAGNETIC TRANSDUCER WITH NANO-OXIDE EXCHANGE COUPLED FREE LAYERS

(75) Inventor: Hardayal Singh Gill, Palo Alto, CA (US)

(73) Assignee: International Business Machines Corporation, Armonk, NY (US)

(*) Notice: Subject to any disclaimer, the term of this patent is extended or adjusted under 35 U.S.C. 154(b) by 93 days.

(21) Appl. No.: 09/922,408

(22) Filed: Aug. 3, 2001

(65) Prior Publication Data

US 2003/0026049 A1 Feb. 6, 2003

(51) Int. Cl.$^7$ ............................................. G11B 5/39
(52) U.S. Cl. .................................. 360/314; 360/324.12
(58) Field of Search ........................ 360/324.1–324.12, 360/314

(56) References Cited

U.S. PATENT DOCUMENTS

| | | |
|---|---|---|
| 5,408,377 A | 4/1995 | Gurney et al. |
| 5,648,885 A | 7/1997 | Nishioka et al. |
| 5,668,688 A | 9/1997 | Dykes et al. |
| 5,751,521 A | 5/1998 | Gill |
| 5,825,595 A | 10/1998 | Gill |
| 5,856,897 A | 1/1999 | Mauri |
| 5,966,272 A | 10/1999 | Cain |
| 6,181,534 B1 | 1/2001 | Gill |
| 6,185,078 B1 | 2/2001 | Lin et al. |
| 6,198,609 B1 | 3/2001 | Barr et al. |
| 6,215,631 B1 | 4/2001 | Fujikata et al. |
| 6,219,208 B1 | 4/2001 | Gill |
| 6,271,997 B1 * | 8/2001 | Gill ....................... 360/324.12 |

FOREIGN PATENT DOCUMENTS

| | | |
|---|---|---|
| EP | 0 871 231 A2 | 10/1998 |
| JP | 2000020922 A1 | 1/2000 |
| WO | WO 01/31357 A1 | 5/2001 |

OTHER PUBLICATIONS

H. Sakakima, et al., "Enhancement of MR ratios using thin oxide layers in PtMn and $\alpha$–$Fe_2O_3$–based spin valves"; J. Magnetism and Magnetic Materials 210(2000) L20–24.

Y. Tsuchiya, et al., "RuRhMn and PtMn Specular Spin–Valve with Magnetic Oxide Layer"; IEEE Transactions on Magnetics, vol. 36, No. 5, Sep. 2000, p. 2557.

H. Sakakima, et al., "Enhanced GMR in PtMn–Based Spin Valves with Specular Reflective Thin Oxide Layers"; IEEE Transactions on Magnetics, vol. 36, No. 5, Sep. 2000, p. 2554.

M. Mao, et al., "Enhanced Spin–Valve Giant Magneto–Resistance in Non–Exchange Biased Sandwiched Films"; IEEE Transactions on Magnetics, vol. 36, No. 5, Sep. 2000, p. 2866.

S. Wang, et al., "Specularity in GMR Spin Valves and In Situ Electrical and Magnetotransport Measurements"; IEEE Transactions on Magnetics, vol. 36, No. 5, Sep. 2000, p.2841.

* cited by examiner

Primary Examiner—A. J. Heinz
(74) Attorney, Agent, or Firm—G. Marlin Knight

(57) ABSTRACT

A magnetic transducer (head) according to the invention includes a free layer structure comprising two free layers exchange coupled across a thin spacer structure of comprising two spacer layers of nonmagnetic material separated by a ferromagnetic nano-oxide layer (NOL). The spacer layers prevent the NOL from unnecessarily hardening the free layer(s). The spacer layers are preferably copper or copper oxide. The spacer layers preserve the NOL's property of specular scattering of conduction electrons which tends to increase the magnetoresistive response. A free layer structure including the exchange coupling spacer structure of the invention can be used in a dual spin valve configuration, but is also useful in a single spin valve configuration. The free layer of the invention is useful in conduction in-plane (CIP), as well as, conduction perpendicular to the plane (CPP) devices.

22 Claims, 3 Drawing Sheets

GMR MAGNETIC TRANSDUCER WITH NANO-OXIDE EXCHANGE COUPLED FREE LAYERS

FIELD OF THE INVENTION

The invention relates to the field of magnetoresistive transducers (heads) and more particularly to magnetoresistive heads used in data storages systems and even more particularly to giant magnetoresistive (GMR) heads.

BACKGROUND OF THE INVENTION

A typical prior art head and disk system is illustrated in FIG. 1. In operation the head 10 is supported by the suspension 13 as it flies above the disk 16. The magnetic transducer, usually called a "head," is composed of elements that perform the task of writing magnetic transitions (the write head 23) and reading the magnetic transitions (the read head 12). The electrical signals to and from the read and write heads 12, 23 travel along conductive paths (leads) 14 which are attached to or embedded in the suspension 13. Typically there are two electrical contact pads (not shown) each for the read and write heads 12, 23. Wires or leads 14 are connected to these pads and routed in the suspension 13 to the arm electronics (not shown). The disk 16 is attached to a spindle 18 that is driven by a spindle motor 24 to rotate the disk 16. The disk 16 comprises a substrate 26 on which a plurality of thin films 21 are deposited. The thin films 21 include ferromagnetic material in which the write head 23 records the magnetic transitions in which information is encoded. The read head 12 reads magnetic transitions as the disk rotates under the air-bearing surface of the head 10.

There are several types of read heads 12 including those using spin valves and tunnel junctions. Spin valves exhibit a much larger magnetoresistive effect than anisotropic magnetoresistive (AMR) sensors and are, therefore, referred to as giant magnetoresistive (GMR) sensors. Thus, heads using spin valves are called GMR heads.

The basic structure of a spin valve sensor (not shown) includes an antiferromagnetic layer, a pinned layer and a free layer. The spin valve effect is a result of differential switching of two weakly coupled ferromagnetic layers separated by a nonmagnetic spacer layer of, for example, copper. The antiferromagnetic layer fixes the magnetic moment of the pinned layer 90 degrees with respect to an air bearing surface (ABS) which is an exposed surface of the sensor that faces the magnetic medium. The quiescent position is the position of the magnetic moment of the free layer when the sense current is conducted through the sensor without magnetic field signals from a rotating magnetic disk. The quiescent position of the magnetic moment of the free layer is preferably parallel to the ABS. The magnetic moment of the free layer is free to rotate in positive and negative directions from a quiescent or zero bias point position in response to positive and negative magnetic signal fields from a moving magnetic medium.

The thickness of the spacer layer is chosen to be less than the mean free path of electrons conducted through the sensor. With this arrangement, a portion of the conduction electrons is scattered by the interfaces or boundaries of the spacer layer with the pinned and free layers. When the magnetic moments of the pinned and free layers are parallel with respect to one another scattering is minimal and when their magnetic moments are antiparallel scattering is maximized. An increase in scattering of conduction electrons increases the resistance of the spin valve sensor and a decrease in scattering of the conduction electrons decreases the resistance of the spin valve sensor. Changes in the resistance of the spin valve sensor is a function of cosine of the angle between the magnetic moments of the pinned and free layers. This resistance is referred to in the art as magnetoresistance (MR).

In one variation the pinned layer function is performed by a multilayer structure which includes a nano-oxide layer (NOL). The free layer may also be multilayer structure which includes an NOL. Use of an NOL in the free or pinned layer structure has been reported to improve the MR ratios through a specular scattering effect of the conduction electrons. The NOLs have also been suggested for use in dual spin valves. (See H. Sakakima, et al., "Enhancement of MR ratios using thin oxide layers in PtMn and $\alpha$-$Fe_2O_3$-based spin valves"; J. Magnetism and Magnetic Materials 210 (2000) L20–24).

In U.S. Pat. No. 5,966,272 W. C. Cain describes a "trilayer" structure for use in a magnetoresistive head which consists of an MR layer, a spacer layer, an exchange layer and a soft adjacent layer(SAL). The MR layer is longitudinally biased by hard magnetic materials at the ends of the MR layer. The SAL produces a transverse bias when the sense current flows through the trilayer structure. The exchange layer also produces a transverse bias which can saturate the SAL with zero current or a small current. The reduction of the sense current needed in the head of '272 is stated to be the improvement over the prior art. The exchange layer is composed of NiO/CoO or FeMn from 15 to 30 nm thick.

In U.S. Pat. No. 6,219,208 the present applicant described the use of a dual spin valve sensor with a self-pinned layer which has its magnetic moment pinned perpendicular to an air bearing surface by sense current fields from conductive layers in the dual spin valve sensor when a sense current is conducted there through. This scheme eliminates one of the antiferromagnetic pinning layers that is typically employed in a dual spin valve sensor. The self-pinned layer is thin so that its demagnetization field will not be greater than the sense current fields acting thereon. Because of the thinning of the self-pinned layer the spin valve effect of the spin valve sensor is degraded by scattering of conduction electrons at the boundary of the self-pinned layer. In order to overcome this problem a specular reflector layer is employed in contact with the self-pinned layer for reflecting the conduction electrons back into a mean free path of conduction electrons so that the spin valve effect on the self-pinned layer side of the spin valve sensor can be added to another spin valve effect on the other side of the free layer structure for providing a double spin valve effect with an improved read gap, as compared to prior art dual spin valve sensors. Copper, gold and silver are suggested for the specular layers.

Although NOL have been used in the prior art of GMR sensors, the embodiments have suffered from the fact that the NOL material pinned a portion of the free layer and, therefore, increased the coercivity, i.e., hardened the free layer. Thus, there is a need for sensor designs which retain the benefits of the NOL while reducing the undesirable side effects.

SUMMARY OF THE INVENTION

A head according to the invention includes a free layer structure comprising two free layers exchange coupled across a thin spacer structure comprising two spacer layers of nonmagnetic material separated by a ferromagnetic nano-oxide layer (NOL). The spacer layers prevent the NOL from unnecessarily hardening the free layer(s). The spacer layers are preferably copper or copper oxide. The spacer layers preserve the NOL's property of specular scattering of conduction electrons which tends to increase the magnetoresistive response. A free layer structure including the exchange coupling spacer structure of the invention can be used in a dual spin valve configuration, but is also useful in a single spin valve configuration. The free layer structure of the invention is useful in conduction in-plane (CIP), as well as, conduction perpendicular to the plane (CPP) devices. Many prior art CPP devices have been impractical due to their low resistance. The free layer structure of the invention provides an additional benefit for CPP devices by raising the resistance due to the resistive properties of the NOL's.

DETAILED DESCRIPTION OF THE INVENTION AND THE PREFERRED EMBOIDEMTNS

Figure 1:
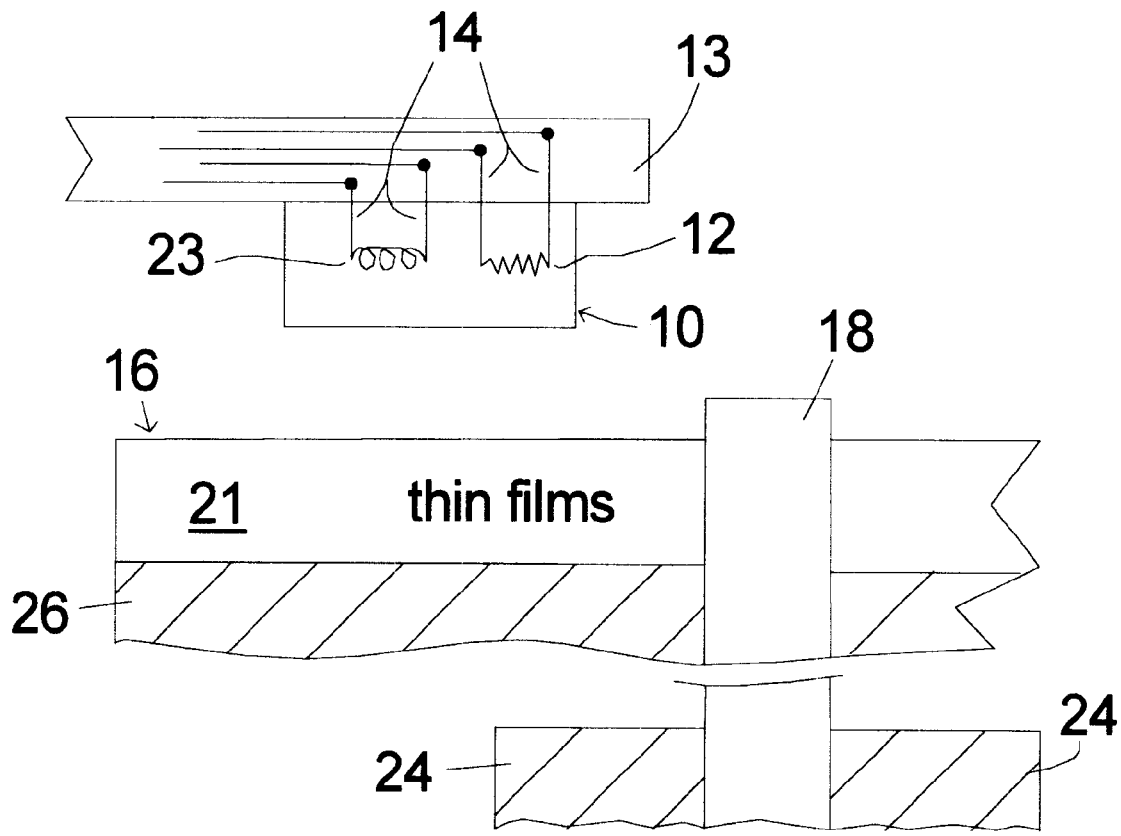
FIG. 1 is an illustration of the prior art showing the relationships between the head and associated components in a disk drive.

A first embodiment of the invention will be described with reference to FIG. 2 which illustrates a section of read head 30 embodying the invention. Only the left side of the section as viewed from the air bearing surface is shown, since the right side is identical. The lead pad 32 provides the electrical connection to the read head 30. In a typical arrangement the lead pad 32 is in contact with a hard bias material 34. This lead arrangement results in the sense current flowing in the plane of the thin film layers, thus, the read head 30 is a CIP device. The miscellaneous layers 37 include the substrate, gap, shield, etc. The spin valve 39 is composed of multiple structures that will be described below. The pinned layers 36A, 36B are disposed on opposite sides of the spin valve 39. The pinned layers may themselves be multilayer structures as are known in the art. The free layer structure 40 is disposed between the pinned layers 36A, 36B. The free layer structure 40 is composed of two free layers 38A, 38B which are separated by an exchange coupling spacer structure (ECS) 42. The exchange coupling spacer structure 42 includes two outer nonmagnetic spacer layers 41A, 41B which may be electrically conductive or insulating. A ferromagnetic nano-oxide layer 43 is disposed between the two outer layers 41A, 41B. The ferromagnetic nano-oxide layer 43 provides exchange coupling between the two free layers 38A, 38B. The spacer layers 41A, 41B keep the free layers 38A, 38B magnetically soft. The spacer layers 41A, 41B are preferably copper (Cu) or copper oxide (CuO) and are approximately 0.5 to 1.0 nm thick. The NOL can be any ferromagnetic oxide such as cobalt iron oxide, nickel oxide or iron oxide and is also approximately 0.5 to 1.5 nm thick.

The free layers 38A, 38B are preferably a ferromagnetic alloy of cobalt (Co), iron (Fe) with any other suitable elements (CoFeX). The pinned layer structure 36A, 36B can be any alternative based on the prior art, but the preferred structure is:

AFM/CoFe/Ru/CoFe/NOL/CoFe/Cu where the antiferromagnetic (AFM) structure is the farthest away from the free layers 38A, 38B. Although this embodiment of the invention has two pinned layer structures 36A, 36B, the invention is also useful in embodiments with a single pinned layer structure.

The embodiment described above connects the leads to spin valve structure at opposing ends of the layers which means that the sense current flows in the plane of the layers and the sensor is a current-in-plane (CIP) device. The exchange coupling spacer structure 42 of the invention can also be employed in spin valves in which the sense current is the current-perpendicular-to-plane (CPP). An example of a prior art CPP spin valve is found in U.S. Pat. No. 5,668,688 to Dykes, et al. FIG. 3 of the present application illustrates a CPP read head 50 according to the invention in a partial section taken parallel to the air bearing surface of the head. As in FIG. 2 only one side is shown, since the other is identical. The ends of the spin valve layer stack 39 abut dielectric material 54. The conductive leads 52A, 52B contact the respective pinned layers 36A, 36B. The sense current in this design flows between conductive leads 52A, 52B perpendicular to the plane of the layers in the spin valve 39. The CPP approach is believed to reduce shunting currents which reduce the spin-dependent electron scattering and to therefore, increase the magnetoresistive effect. Because the sense current flows in series through the layers of the spin valve 39, the resistance of the nano-oxide layer (NOL) 43 adds to the total resistance. Since prior art CPP designs have had undesirably low resistance on the order of milliohms, the additional resistance of the NOL improves the design.

Except where express thickness values have been given above, the layers, structures and materials in a head embodying the invention are according to the prior art and are fabricated according to the prior art.

Figure 2:
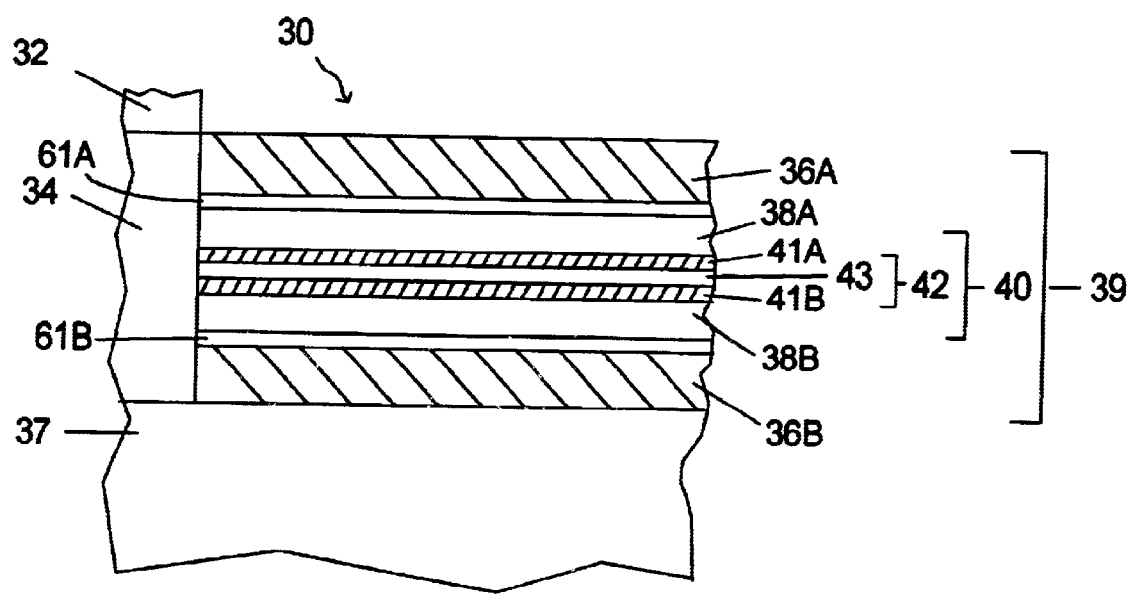
FIG. 2 is an illustration of a partial section, parallel to the air bearing surface, of a transducer illustrating the layer structures of the invention embodied in a current in-plane sensor.
Figure 3:
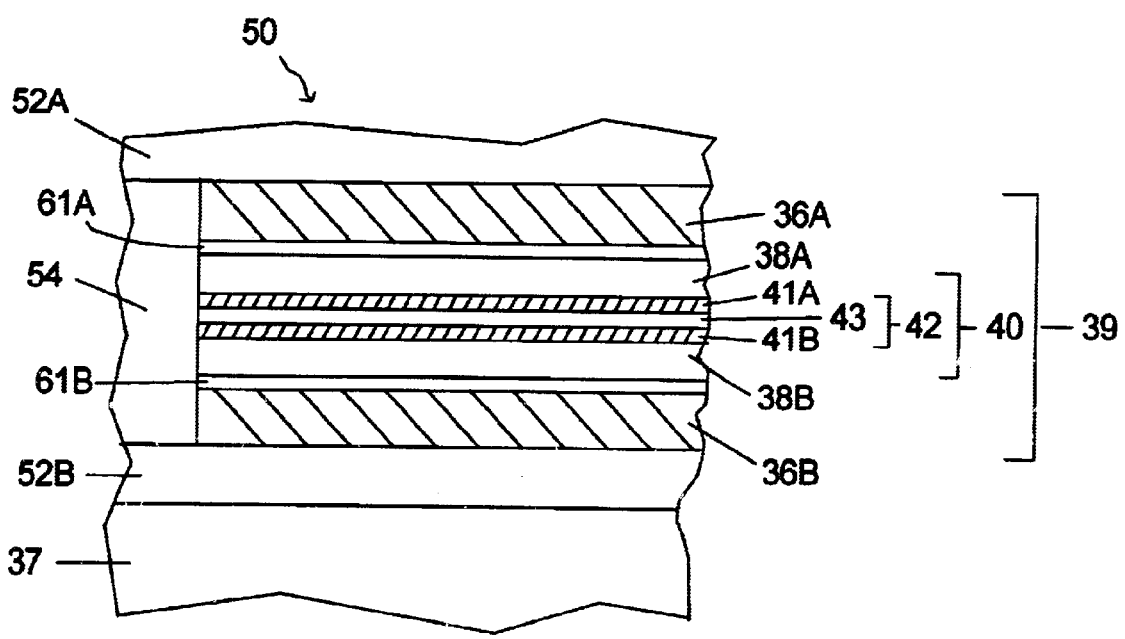
FIG. 3 is an illustration of a partial section, parallel to the air bearing surface, of a transducer illustrating the layer structures of the invention embodied in a current perpendicular to the plane sensor.

Transducers according to the invention can be fabricated in a magnetron sputtering or an ion beam sputtering system to sequentially deposit the multilayer structure shown in FIGS. 2 and 3. The method of manufacturing transducers according to the invention is in accordance with the prior art except as follows. The free layer structure of the invention is formed by depositing material for the first free layer; depositing the first spacer layer of nonmagnetic material; depositing the NOL, depositing the second spacer layer of nonmagnetic, material; and depositing materials for the second free layer.

The compositions given herein have been described without regard to small amounts of impurities that are inevitably present in practical embodiments as is well known to those skilled in the art.

Although the embodiments of the invention have been described in a particular spin valve head environment, the exchange coupled free layer structure as described herein is not limited to this application. Those skilled in the art will recognize that the invention may be used in other magnetic transducers.

What is claimed is:

1. A transducer for sensing an external magnetic field comprising:
   a first pinned layer structure having a first magnetization;
   a first nonmagnetic spacer layer adjacent to the first pinned layer structure;
   a first free layer including a ferromagnetic material disposed adjacent the first nonmagnetic spacer layer, the free layer having a second magnetization perpendicular to the first magnetization in the absence of an external field;

an exchange coupling spacer structure including a ferromagnetic nanooxide layer and second and third nonmagnetic spacer layers disposed on opposing sides of the ferromagnetic nano-oxide layer;

a second free layer including a ferromagnetic material disposed parallel to the first free layer and separated from the first free layer by the exchange coupling spacer structure, the first and second free layers being exchanged coupled through the ferromagnetic nano-oxide layer and having a free layer magnetization perpendicular to the pinned layer magnetization in the absence of an external field;

a fourth nonmagnetic spacer layer; and a second pinned layer structure disposed adjacent to the fourth nonmagnetic spacer layer on a side of the second free layer farthest away from the exchange coupling spacer structure and having the first magnetization.

2. The transducer of claim 1 wherein the ferromagnetic nano-oxide layer is approximately 0.5 to 1.5 nm thick.

3. The transducer of claim 1 wherein the second and third nonmagnetic spacer layers are electrically conductive.

4. The transducer of claim 1 wherein the second and third nonmagnetic spacer layers are electrically insulating.

5. The transducer of claim 1 wherein the first and second free layers are an alloy of cobalt and iron.

6. The transducer of claim 1 wherein the first pinned layer structure is AFM/CoFe/Ru/CoFe/NOL/CoFe/Cu.

7. The transducer of claim 1 further comprising first and second lead pads disposed to conduct current through the first and second free layers in a plane of the first and second free layers making the transducer a conduction in-plane device.

8. The transducer of claim 1 further comprising first and second lead pads disposed to conduct current through the first and second free layers perpendicular to a plane of the first and second free layers making the transducer a conduction perpendicular to the plane device.

9. The transducer of claim 8 wherein the first and second lead pads are electrical contact with the first and second pinned layer structures respectively.

10. The transducer of claim 9 wherein the ferromagnetic nano-oxide layer is electrically resistive.

11. The transducer of claim 1 wherein the ferromagnetic nano-oxide layer is cobalt iron oxide, nickel oxide or iron oxide.

12. A disk drive comprising:

a disk having a thin film of ferromagnetic material on a planar surface of the disk;

a spindle rotatably supporting the disk; and a magnetic transducer having an air bearing surface supported over the planar surface of the disk, the magnetic transducer including:

a first pinned layer structure having a first magnetization;

a first nonmagnetic spacer layer adjacent to the first pinned layer structure;

a first free layer including a ferromagnetic material disposed adjacent the first nonmagnetic spacer layer, the free layer having a second magnetization perpendicular to the first magnetization in the absence of an external field;

an exchange coupling spacer structure including a ferromagnetic nano-oxide layer and second and third nonmagnetic spacer layers disposed on opposing sides of the ferromagnetic nano-oxide layer;

a second free layer including a ferromagnetic material disposed parallel to the first free layer and separated from the first free layer by the exchange coupling spacer structure, the first and second free layers being exchanged coupled through the ferromagnetic nano-oxide layer and having a free layer magnetization perpendicular to the pinned layer magnetization in the absence of an external field;

a fourth nonmagnetic spacer layer; and a second pinned layer structure disposed adjacent to the fourth nonmagnetic spacer layer on a side of the second free layer farthest away from the exchange coupling spacer structure and having the first magnetization.

13. The disk drive of claim 12 wherein the ferromagnetic nano-oxide layer is approximately 0.5 to 1.5 nm thick.

14. The disk drive of claim 12 wherein the second and third nonmagnetic spacer layers are electrically conductive.

15. The disk drive of claim 12 wherein the second and third nonmagnetic spacer layers are electrically insulating.

16. The disk drive of claim 12 wherein the first and second free layers are an alloy of cobalt and iron.

17. The disk drive of claim 12 wherein the first pinned layer structure is AFM/CoFe/Ru/CoFe/NOL/CoFe/Cu.

18. The disk drive of claim 12 further comprising first and second lead pads disposed to conduct current through the first and second free layers in a plane of the first and second free layers making the transducer a conduction in-plane device.

19. The disk drive of claim 12 further comprising first and second lead pads disposed to conduct current through the first and second free layers perpendicular to a plane of the first and second free layers making the transducer a conduction perpendicular to the plane device.

20. The disk drive of claim 19 wherein the first and second lead pads are electrical contact with the first and second pinned layer structures respectively.

21. The disk drive of claim 20 wherein the ferromagnetic nano-oxide layer is electrically resistive.

22. The disk drive of claim 12 wherein the ferromagnetic nano-oxide layer is cobalt iron oxide, nickel oxide or iron oxide.

* * * * *

UNITED STATES PATENT AND TRADEMARK OFFICE
CERTIFICATE OF CORRECTION

PATENT NO.     : 6,636,389 B2
DATED          : October 21, 2003
INVENTOR(S)    : Gill; Hardayal Singh It is certified that error appears in the above-identified patent and that said Letters Patent is hereby corrected as shown below:

Column 2,
After line 6, insert -- A variation of a spin valve sensor is a dual spin valve which has a ferromagnetic free layer structure between nonmagnetic conductive first and second spacer layers with the first and second spacer layers are located between first and secondferromagnetic pinned layer structures. --.

Column 3,
Line 48, after the words "...disposed between the pinned layers 36A, 36B", insert -- and is separated from the pinned layers 36A, 36B by spacer layers 61A and 61B. --.

Signed and Sealed this

Twenty-fifth Day of October, 2005

JON W. DUDAS
*Director of the United States Patent and Trademark Office*